US010698610B2

(12) United States Patent
Yang

(10) Patent No.: US 10,698,610 B2
(45) Date of Patent: Jun. 30, 2020

(54) STORAGE SYSTEM AND METHOD FOR PERFORMING HIGH-SPEED READ AND WRITE OPERATIONS

(71) Applicant: Western Digital Technologies, Inc., San Jose, CA (US)

(72) Inventor: Nian Niles Yang, Mountain View, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/903,930

(22) Filed: Feb. 23, 2018

(65) Prior Publication Data

US 2019/0265888 A1  Aug. 29, 2019

(51) Int. Cl.
*G06F 12/00* (2006.01)
*G06F 3/06* (2006.01)
*G11C 16/34* (2006.01)

(52) U.S. Cl.
CPC ............ *G06F 3/061* (2013.01); *G06F 3/0619* (2013.01); *G06F 3/0634* (2013.01); *G06F 3/0653* (2013.01); *G06F 3/0688* (2013.01); *G11C 16/349* (2013.01); *G11C 16/3459* (2013.01)

(58) Field of Classification Search
CPC ...... G06F 3/061; G06F 3/0619; G06F 3/0634; G06F 3/0688; G06F 3/0653; G11C 16/3459; G11C 16/349
See application file for complete search history.

(56) References Cited

U.S. PATENT DOCUMENTS

| | | | |
|---|---|---|---|
| 6,154,853 A * | 11/2000 | Kedem | G06F 11/1084 711/114 |
| 6,349,059 B1 | 2/2002 | Bartoli et al. | |
| 6,944,067 B2 | 9/2005 | Mudge et al. | |
| 8,499,206 B2 | 7/2013 | Cho et al. | |
| 8,750,042 B2 | 6/2014 | Sharon et al. | |
| 2011/0126045 A1* | 5/2011 | Bennett | G06F 11/1068 714/6.22 |
| 2013/0028021 A1* | 1/2013 | Sharon | G11C 11/5642 365/185.17 |
| 2015/0004763 A1* | 1/2015 | Lue | H01L 27/11524 438/257 |
| 2015/0378801 A1* | 12/2015 | Navon | G06F 11/076 714/704 |
| 2016/0118111 A1* | 4/2016 | Hyun | G11C 11/5621 365/185.03 |
| 2018/0182465 A1* | 6/2018 | Alhussien | G06F 11/10 |

FOREIGN PATENT DOCUMENTS

WO    2011-025679 A1    3/2011

OTHER PUBLICATIONS

Search Report and Written Opinion in co-pending Appln. No. PCT/US2018/066434, dated Apr. 2, 2019.

* cited by examiner

*Primary Examiner* — Kalpit Parikh
(74) *Attorney, Agent, or Firm* — Dickinson Wright PLLC; Steven Hurles

(57) ABSTRACT

A storage system and method for performing high-speed read and write operations are disclosed. In general, these embodiments discuss ways for performing a fast read in response to determining that the fast read will probably not have a negative impact on performance due to error correction and performing a fast write in response to determining that a storage system criterion is satisfied.

15 Claims, 11 Drawing Sheets

STORAGE SYSTEM AND METHOD FOR PERFORMING HIGH-SPEED READ AND WRITE OPERATIONS

BACKGROUND

It is sometimes desired to have faster-than-normal reads and writes in a storage system (e.g., in a solid state drive (SSD)). For example, as random reads take longer than sequential reads, it may be desired to increase the read speed of random reads. To increase read speed, the design of the storage system can be changed to provide more parallelism, but this can comes at the expense of increased volatile memory (e.g., RAM), power, and complexity. Also, for a low-queue-depth read, more parallelism may not be an effective design choice. As another option to improve read speed, memories can be screened for speed during manufacturing to "cherry pick" the fastest memories of a certain storage system. However, this may be at the expense of memory yield and wafer cost. As yet another option, the trim on the memory can be tuned to reduce the read margin. While this can provide a faster read, it can come at the cost of data integrity, as reducing the read margin (e.g., by reading the memory before a preferred read voltage is reached) can increase the bit error rate.

Increasing write speed may also be desired. For example, some storage systems use meta-block and jumbo block designs to operate on multiple memory dies via different channels in parallel to enhance the system's sequential write performance. Other storage systems use large volatile memory to cache data for programming and read the data in response to a host request. Some storage systems provide program speed improvement via a special trim command to enhance memory cell behavior for high-program speed at the memory level.

DETAILED DESCRIPTION

Overview

Figure 1A:
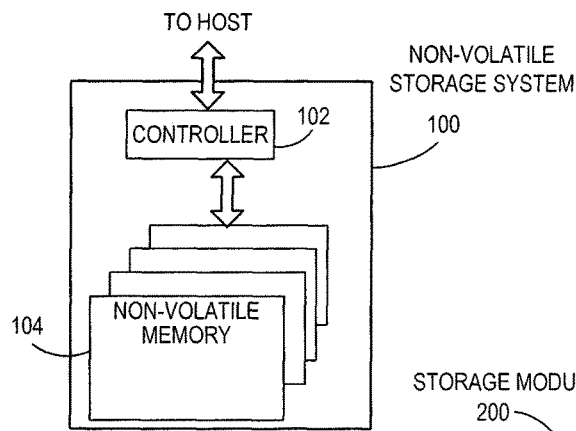
FIG. 1A is a block diagram of a non-volatile storage system of an embodiment.

By way of introduction, the below embodiments relate to a storage system and method for performing high-speed read and write operations.

In one embodiment, a method for reading a memory of a storage system is provided that is performed in a storage system comprising a memory configured to operate in a first read mode and a second read mode, wherein the first read mode is faster than the second read mode but can result in an increased bit error rate. The method comprises determining whether to operate the memory in the first read mode based on whether operating the memory in the first read mode will likely increase a bit error rate above a threshold; and in response to determining that operating the memory in the first read mode will not likely increase the bit error rate above the threshold, operating the memory in the first read mode.

In some embodiments, the method further comprises increasing a power supply to the memory when operating the memory in the first read mode.

In some embodiments, determining whether to operate the memory in the first read mode is performed in response to receiving a request for a random read.

In some embodiments, a likelihood that the bit error rate will increase above the threshold is based on a temperature of the memory.

In some embodiments, a likelihood that the bit error rate will increase above the threshold is based on a location of a word line to be read in the memory.

In some embodiments, the memory comprises a multi-level cell (MLC) memory, and wherein a likelihood that the bit error rate will increase above the threshold is based on a location of page to be read in the memory.

In some embodiments, a likelihood that the bit error rate will increase above the threshold is based on a power supply level.

In some embodiments, the storage system is embedded in a host.

In another embodiment, a storage system is provided comprising: a memory configured to operate in a first write mode and a second write mode, wherein the first write mode is faster than the second write mode; and a controller configured to: determine whether to instruct the memory to operate in the first write mode based on whether a storage system criterion is satisfied; and in response to determining that the storage system criterion is satisfied, instruct the memory to operate in the first write mode.

In some embodiments, the storage system criterion is satisfied when a program-erase count of the memory is under a threshold.

In some embodiments, the storage system comprises an error correction code encoder configured to operate at a first encoding speed, the memory comprises a plurality of memory dies, and the storage system criterion is satisfied when a memory die parallel operating speed is less than the first encoding speed.

In some embodiments, the memory comprises a plurality of memory dies, and wherein the storage system criterion is satisfied when a number of memory dies being operated in parallel is below a threshold.

In some embodiments, the storage system criterion is satisfied when the memory comprising single-level cells (SLCs).

In some embodiments, the second write mode performs a verify operation to check that data has been written correctly in the memory, whereas the first write mode does not.

In some embodiments, the memory comprises a three-dimensional memory.

In some embodiments, the storage system is embedded in a host.

In another embodiment, a storage system is provided comprising a memory; and at least one of the following: means for performing a fast read in response to determining that the fast read will probably not have a negative impact on performance due to error correction; and means for performing a fast write in response to a storage system criterion being satisfied.

In some embodiments, the memory comprises a three-dimensional memory.

In some embodiments, the storage system is embedded in a host.

Other embodiments are possible, and each of the embodiments can be used alone or together in combination. Accordingly, various embodiments will now be described with reference to the attached drawings.

EMBODIMENTS

Figure 1B:
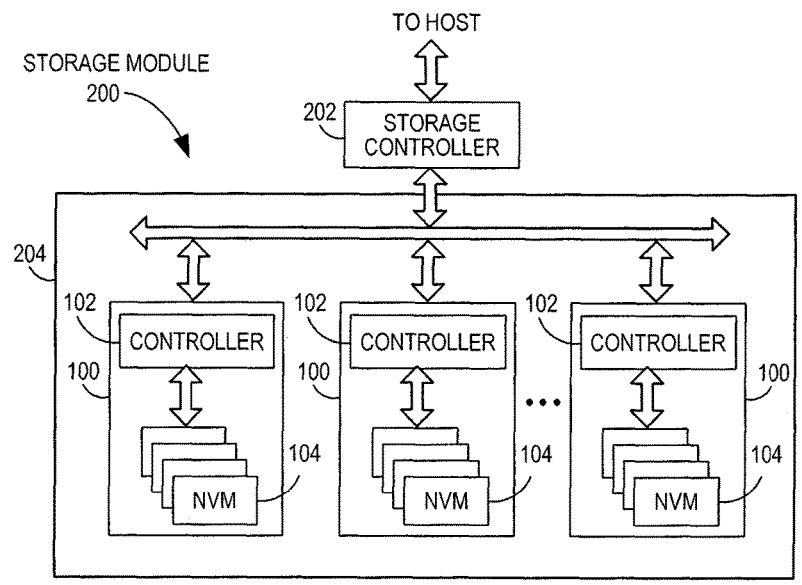
FIG. 1B is a block diagram illustrating a storage module of an embodiment.
Figure 1C:
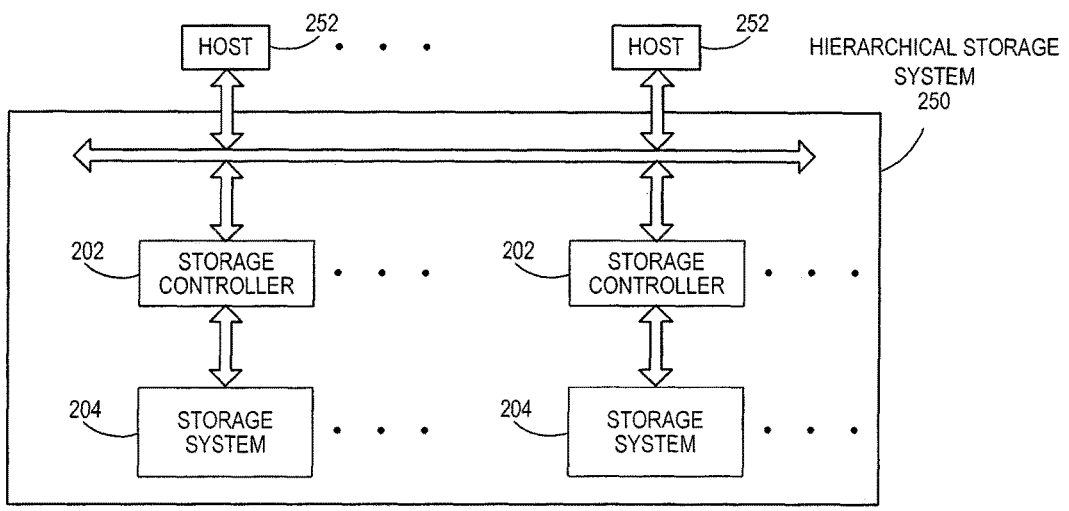
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some NAND storage system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
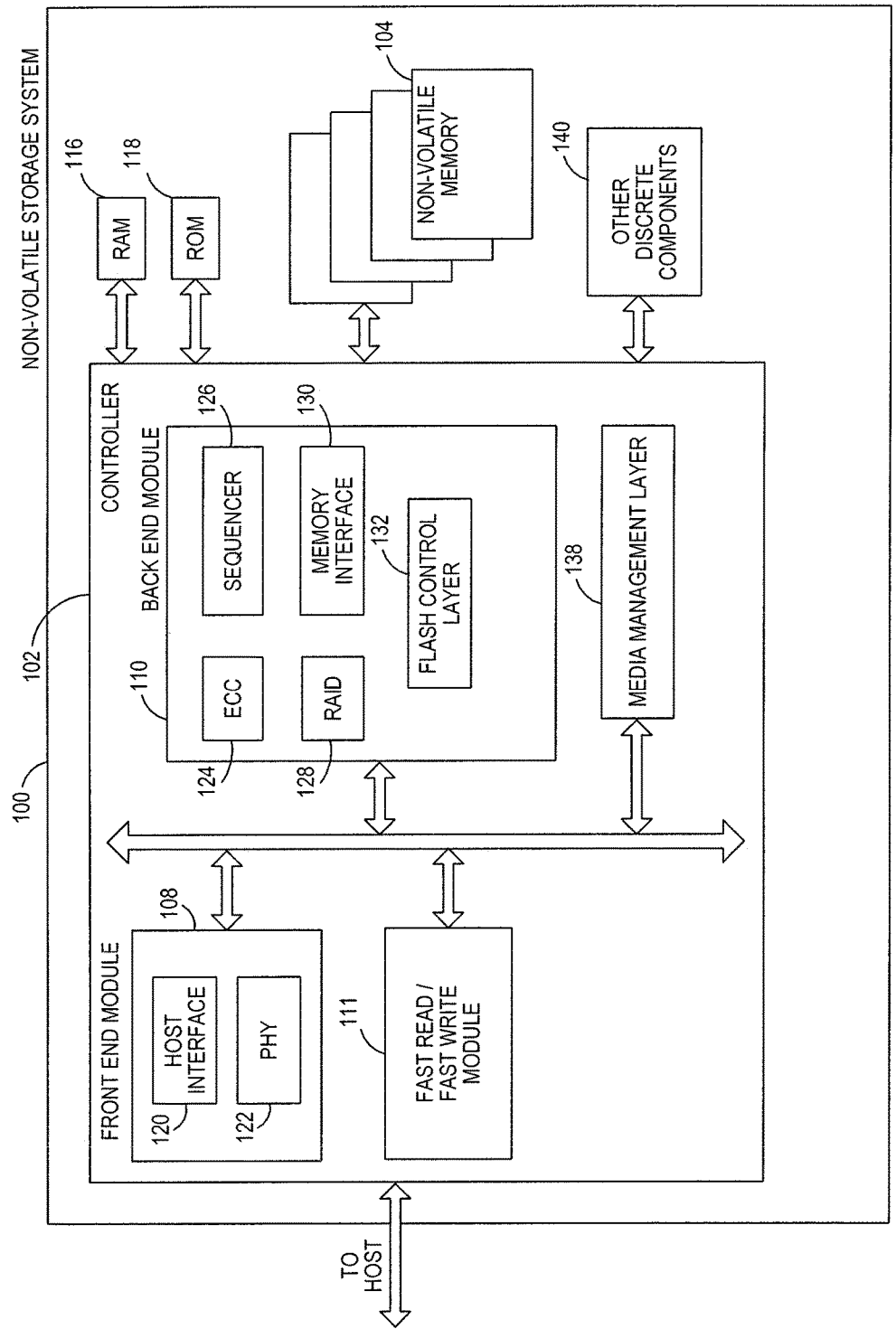
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include an fast read/fast write module 111, which is discussed in more detail below, and can be implemented in hardware or software/firmware.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
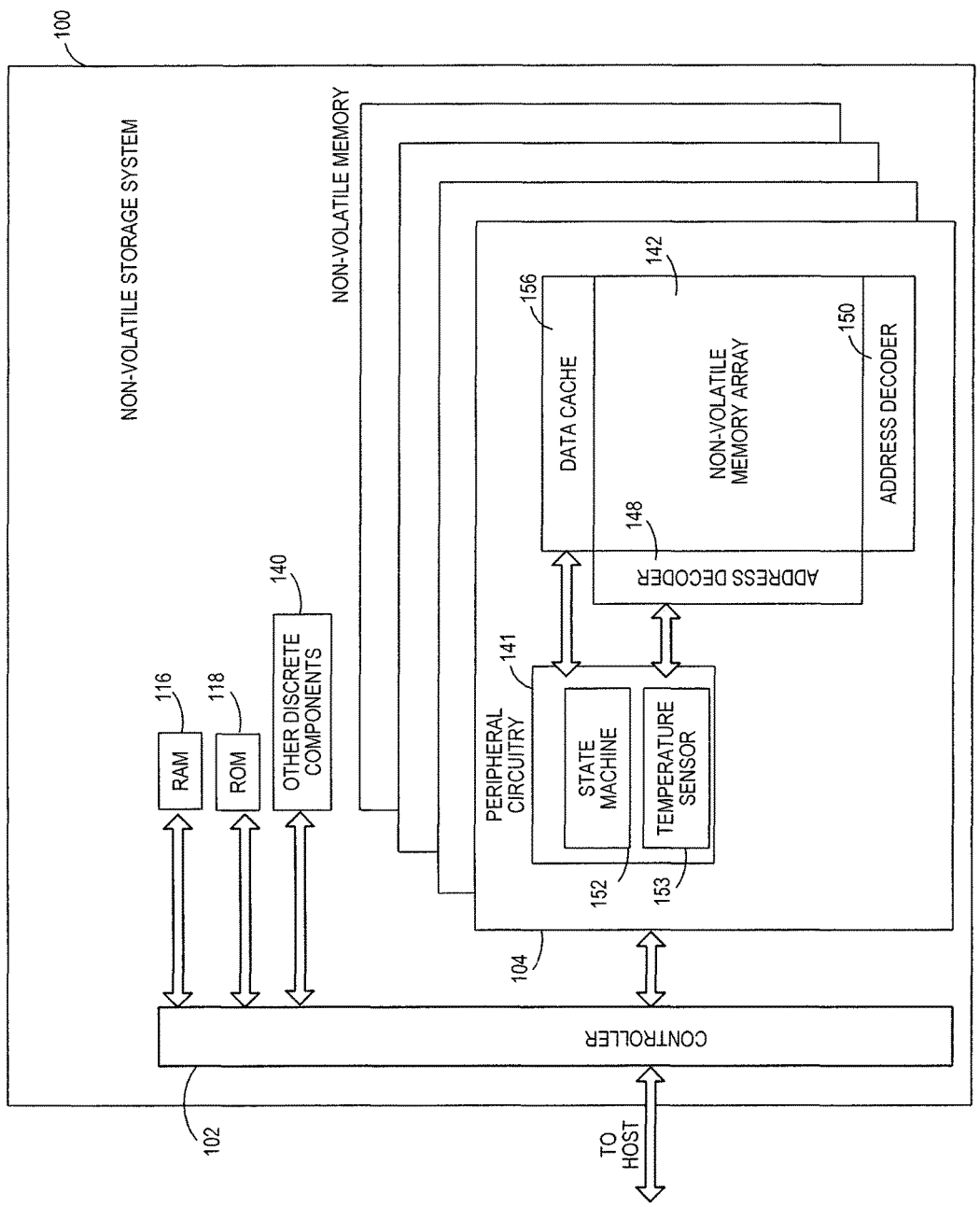
FIG. 2B is a block diagram illustrating components of the non-volatile memory storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102 and a temperature sensor 153 that can detect the temperature of the memory. Any suitable technology can be used to implement the temperature sensor 153, including technology currently employed in conventional memory temperature sensors. Also, it should be noted that while the temperature sensor 153 is located in the memory die 104 in this embodiment, the temperature sensor 153 can be located in another component in the storage system 100, such as the controller 102, or can be a separate component in the storage system 100.

Figure 3:
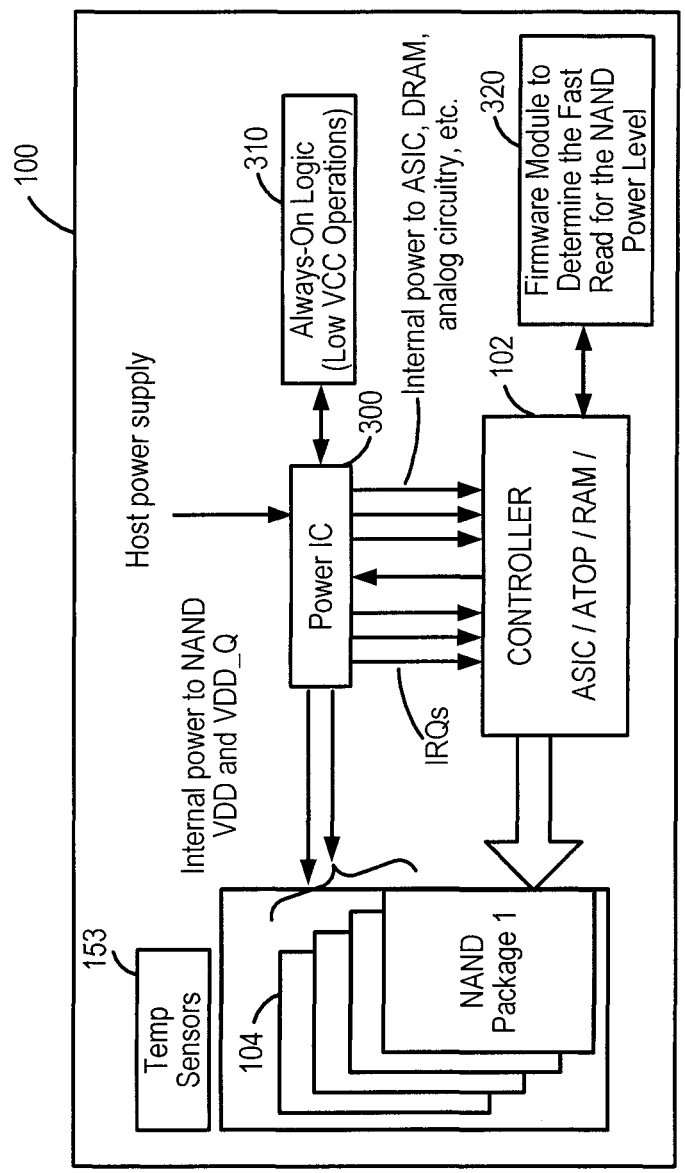
FIG. 3 is a block diagram of a memory system of an embodiment.

Turning again the drawings, FIG. 3 shows another view of the storage system 100 of one embodiment, which illustrates the storage system's power circuitry with respect to other components and its control signals and output interrupt signals. As shown in FIG. 3, the storage system 100 comprises a memory 104 (here, a plurality of NAND packages) with one or more temperature sensors 153, a controller 102 (here, including an application-specific integrated circuit (ASIC), an analog "top" layer (ATOP), and RAM), and a power supply 300 (here, a power integrated circuit (IC), which may also be referred to as the power management integrated circuit (PMIC). The power supply 300 receives power from a host, regulates the power, and supplies it to the NAND dies 104 and to the controller ASIC 102 (via internal and external interrupt requests (IRQs). The controller storage system 100 also comprises always-on logic 310 for low-voltage operations and firmware 302 to determine the fast read for the NAND power level. The firmware 302 can take the form of the fast read/fast write module 111 mentioned previously.

As mentioned above, it is sometimes desired to have faster-than-normal reads and writes in a storage system (e.g., in a solid state drive (SSD)). For example, as random reads take longer than sequential reads, it may be desired to increase the read speed of random reads. To increase read speed, the design of the storage system can be changed to provide more parallelism, but this can comes at the expense of increased volatile memory (e.g., RAM), power, and complexity. Also, for a low-queue-depth read, more parallelism may not be an effective design choice. As another option to improve read speed, memories can be screened for speed during manufacturing to "cherry pick" the fastest memories of a certain storage system. However, this may be at the expense of memory yield and wafer cost.

As yet another option, the trim on the memory can be tuned to reduce the read margin. In this situation, the memory can be operated in one of two read modes. In a "normal" read mode, internal circuitry in the memory die waits until the read voltage applied to a wordline in the memory reaches a predetermined voltage level before reading memory cells on the wordline, as the memory cells can be reliably read at the a predetermined voltage level. The read voltage is supplied by a voltage pump, and, due to the physics involved in generating voltage, it can take some time for the voltage pump to supply the predetermined voltage level. For example, if the predetermined voltage level is 3.0 V, the voltage pump may go through a series of overshoots (e.g., regulating up to 3.3 V) and undershoots (e.g., regulating down to 2.8 V) before settling on 3.0 V. In some storage system, this settling process can take several microseconds.

Figure 4:
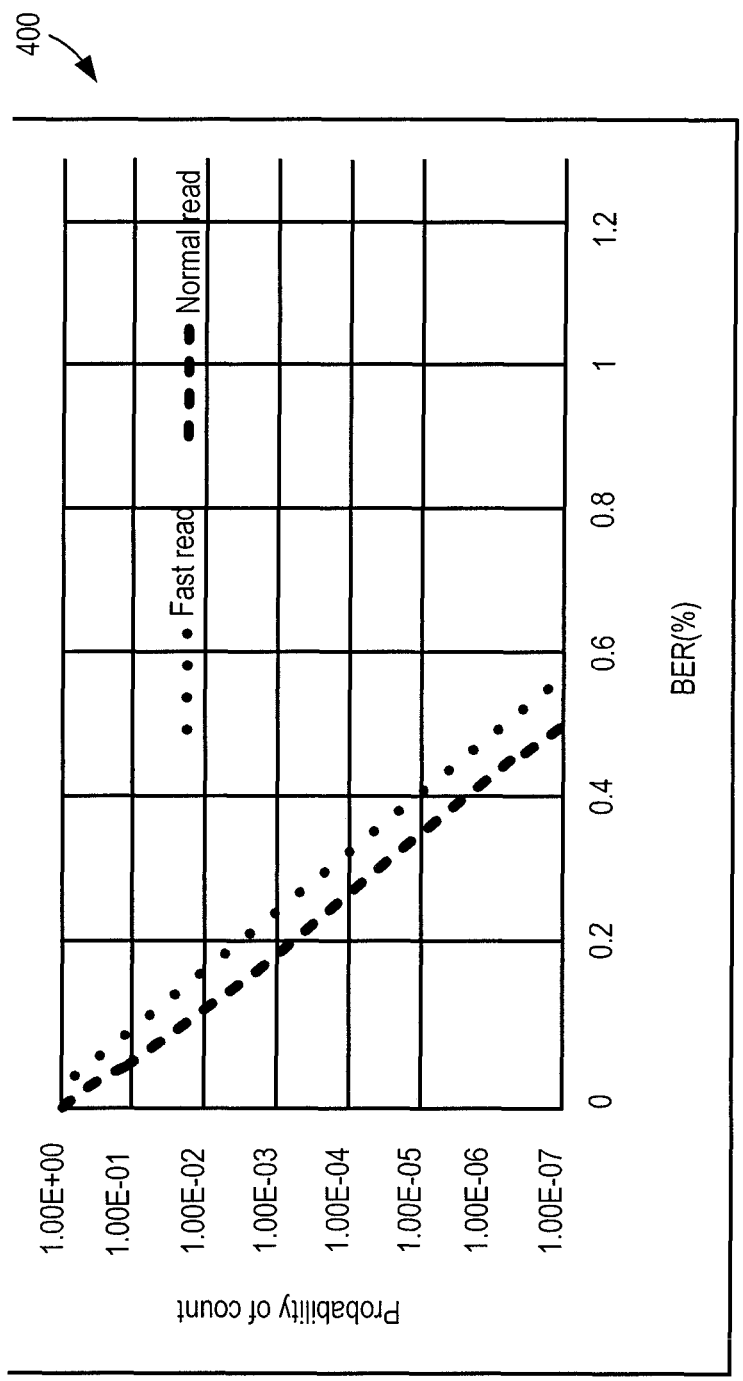
FIG. 4 is an illustration of bit-error-rate differences between a normal read and a fast read of an embodiment.

For a fast read, the controller can instruct the memory to operate differently (e.g., to tune the trim on the memory to reduce the read margin). In a fast read, the memory does not wait until read voltage reaches the predetermined level before reading memory cells on the wordline. For example, if the normal read mode needs to wait 20 microseconds to generate the read voltage and have it settle to the predetermined level, the fast read mode can be performed the read at 10 microseconds. Because the fast read mode does not wait for the read voltage to settle, the read voltage in a fast read may not be reliably at 3.0 V (e.g., it might be at 2.8 V or at 3.3 V). As a result, if the read voltage is not at the predetermined level, it is possible that a memory cell read during the fast read mode will not be read correctly (e.g., a "0" might be read as a "1," and a "1" might be read as a "0"). Accordingly, a faster read can come at the cost of data integrity, as reducing the read margin (e.g., by reading the memory before the preferred read voltage is reached) can increase the bit error rate (BER). This is illustrated in FIG. 4, which is an illustration 400 of bit-error-rate differences between a normal read and a fast read of an embodiment. As shown in FIG. 4, fast read, which be as much as 29% faster than a normal read mode in an embodiment, comes at the cost of a higher bit error rate. For example, a bit-error rate of 0.2 is more likely during a fast read than a normal read. To help reduce the bit error rate, the controller 102 can increase the power supply to the memory 104 when operating the memory 104 in the fast read mode. This is because the higher the power supply, the faster it is for the voltage pump to regulate the read voltage (e.g., increasing Vcc by the PMIC can shorten the settling time and get to predetermined read voltage more quickly).

Figure 5:
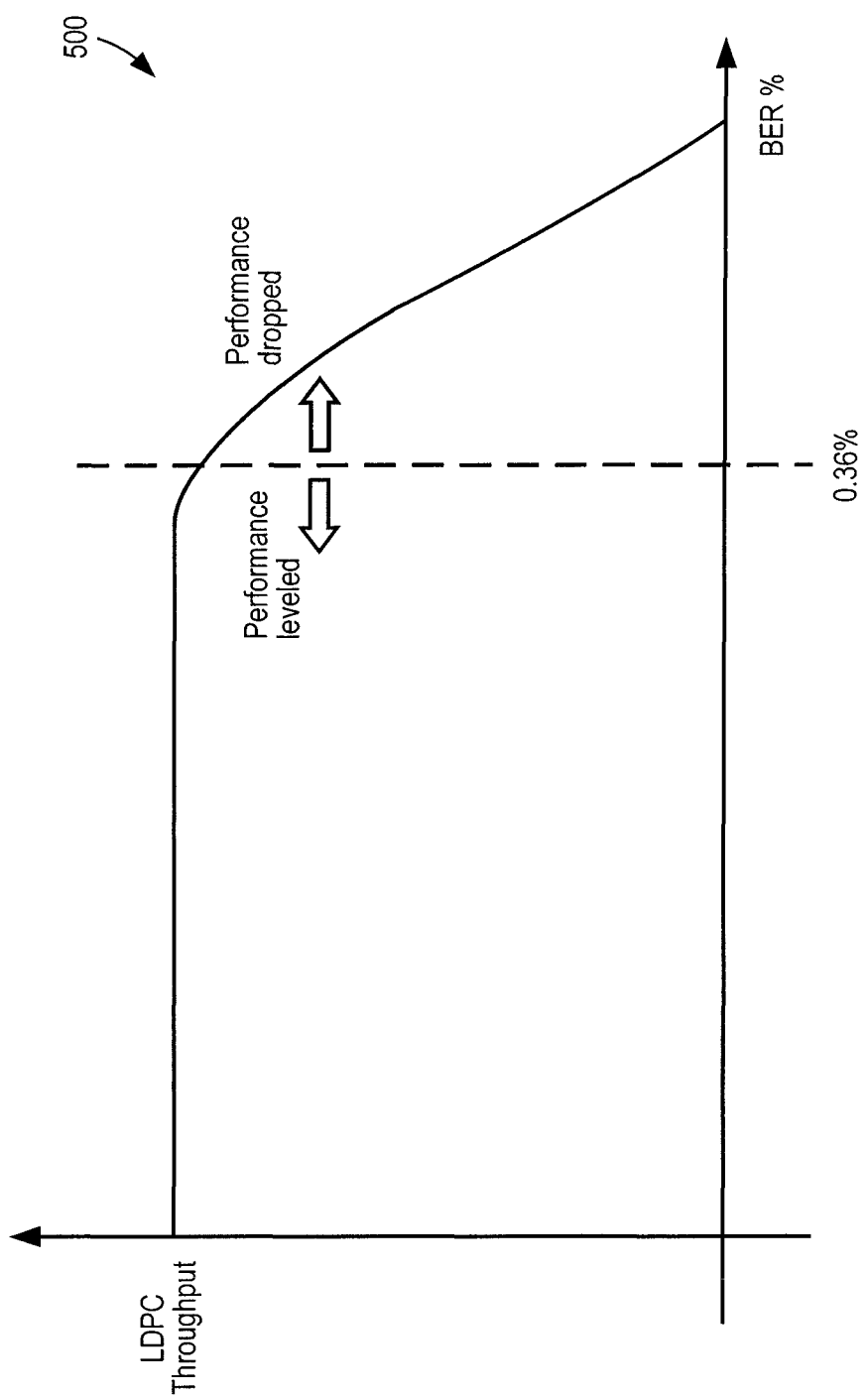
FIG. 5 is a graph of LDPC throughput versus bit error rate of an embodiment.

As mentioned above, the storage system 100 comprises error correction functionality 124 (e.g., low-density parity-check code (LDPC)), which can correct a certain number of errors. This is illustrated in FIG. 5, which is a graph 500 of LDPC throughput versus bit error rate. As shown in FIG. 5, the performance of the storage system 100 is at an acceptable level when the bit-error rate is below a certain level (here, about 0.36%). That is, the system will perform poorly when the bit-error rate is higher than this level due to the slower LDPC throughput. However, after this level, the LDPC throughput starts to drop quickly, negatively impacting the performance of the storage system 100. Accordingly, in this example, if the fast read mode will likely result in a bit-error rate increase that is not greater than the 0.36% threshold, the fast read mode can come without sacrificing performance even though it increases the bit-error rate.

Further, there are certain system conditions that can make it more likely that the bit-error rate will increase more than the threshold. If these system conditions exist, it may be preferred not to perform a fast read, as they can increase the likelihood of the bit-error rate exceeding the performance threshold. For example, as the temperature of the memory 104 increases, the likelihood of errors also increases. As another example, in some memory designs, certain wordlines may be different than other wordlines and more prone to errors. For instance, in a three-dimensional memories, the first five wordlines, which are on the bottom of the physical stack, may be different from the other wordlines in the memory and have less read margin, resulting in a higher likelihood of bit errors. As yet another example, in a multi-level cell (MLC) memory, the likelihood of a bit error can be based on the location of the page being read in the memory. For instance, in a triple-level cell (TLC) memory that has three pages, the middle page tends to have a higher bit-error rate based on memory physics. As yet another example, a bit error can be more likely depending on the power level supplied to the memory 104, with bit errors less likely the greater the power level.

In summary, because of the error correction functionality in the storage system 100, an increase in bit error rate caused by a fast read does not necessarily negatively impact performance if the increased bit-error rate is below a certain threshold. And, as noted above, various system conditions can make it more or less likely that the increased bit-error rate will exceed the threshold. Putting these various factors together, in one embodiment, the controller 102 determines that it should instruct the memory 104 to operate in the fast read mode only if doing so will not likely increase a bit error rate above a threshold. In this way, the controller 102 intelligently determines when to enable the fast read in order to maximize system performance.

It should be noted that the terms "likely" or "likelihood" refer to the fact that the controller 102 may not know with certainty whether or not the bit error rate will go above the threshold based on the various conditions or variables present in the system 100. "Likelihood" can be determined in any suitable way. For example, in one embodiment, the storage system 100 contains a table or other data structure with values associated with various system conditions and variables and compares the total value of the system conditions and variables present at a given time to a number to determine "likelihood." As another example, which will be illustrated in more detail below, different thresholds are set for various system conditions and variables, and the controller 102 checks these thresholds in various combinations in making its determination.

Figure 6:
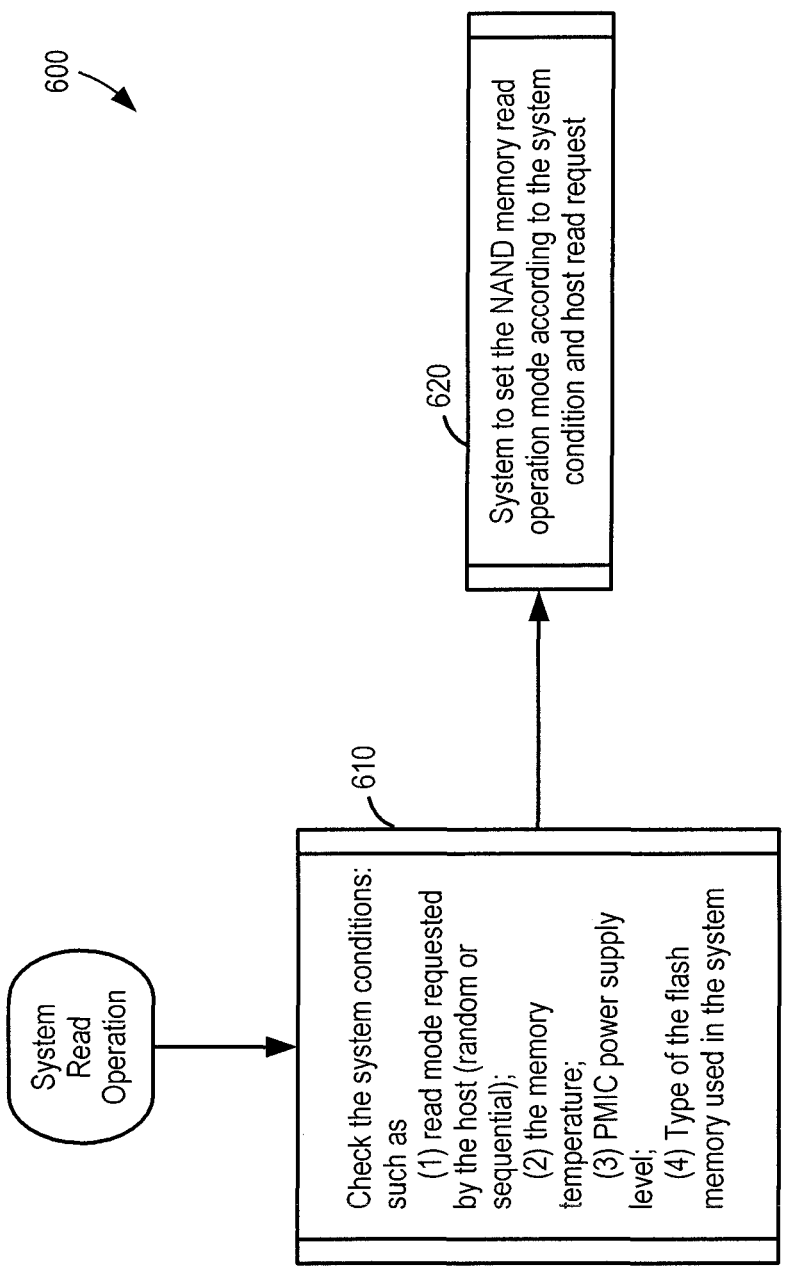
FIG. 6 is a flow chart of an embodiment for optimizing storage system performance with respect to memory behavior.

This process is generally illustrated in the diagram 600 in FIG. 6. As shown in FIG. 6, the controller 102 checks various system conditions (act 610), such as, but not limited to, the read mode requested by the host (e.g., random or sequential), the memory temperature, the power supply level, and/or the type of memory 104 used in the system 100. The controller 102 can set the memory read operation mode according to these conditions (act 620). For example, if the controller 102 determines that it is not likely that the bit-error rate will exceed the threshold, the controller 102 can instruct the memory 104 to perform a fast read. On the other hand, if the controller 102 determines that it is likely that the bit-error rate will exceed the threshold, the controller 102 can let the memory 104 operate in a normal read mode. In some embodiments, the controller 102 only needs to instruct the memory 104 to enter fast read mode (e.g., to change the memory die's internal timing reduction to speed the sensing operation for a certain page to be read out), and no instruction is needed for the memory 104 to perform a normal read, as that is the memory's default. However, in other embodiments, the controller 102 instructs the memory 104 which read mode to operate in (e.g., fast or normal).

Figure 7:
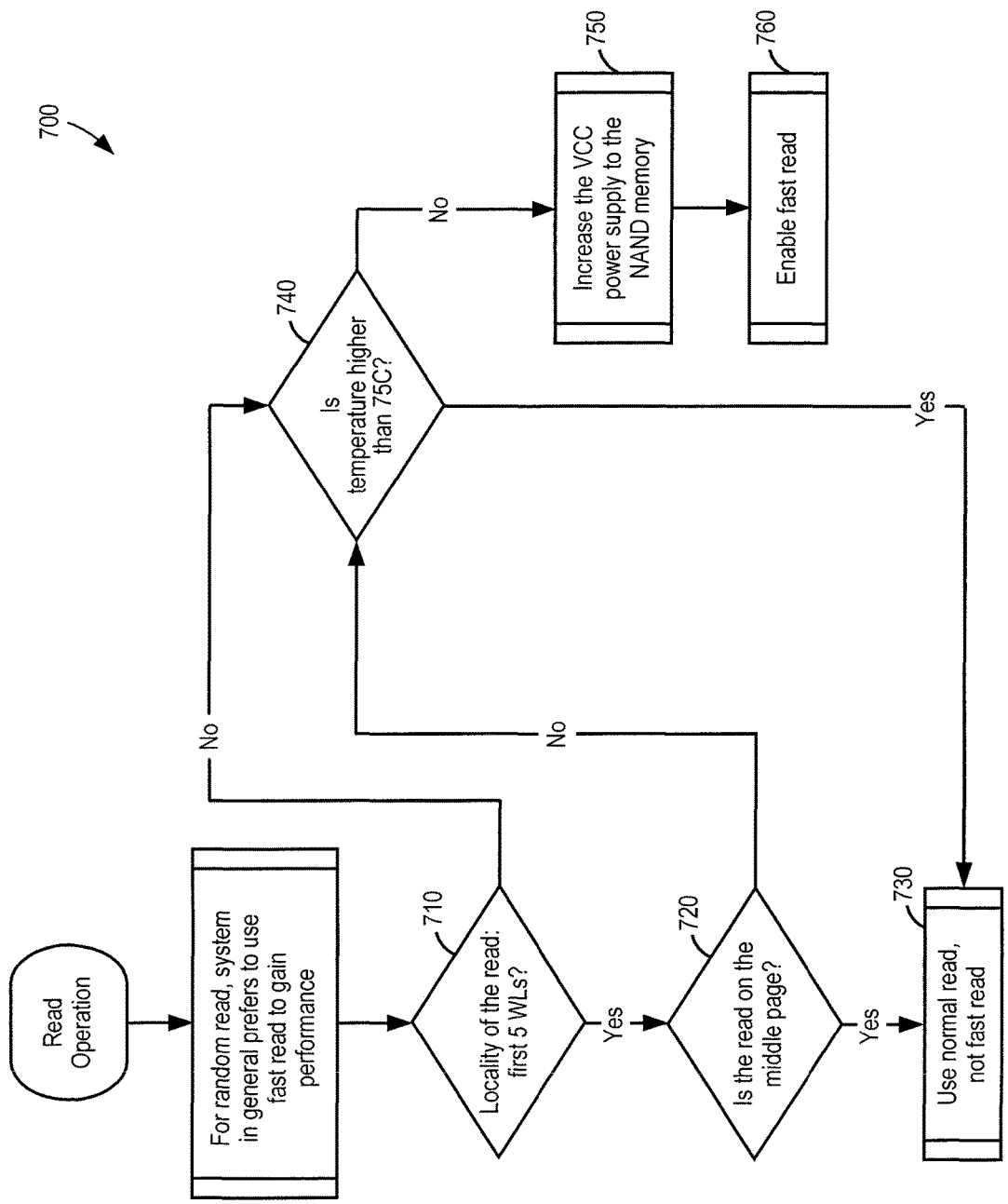
FIG. 7 is flow chart of a method of an embodiment for high speed read.

FIG. 7 is a more-detailed flow chart 700 of an embodiment illustrating this method. In this embodiment, this method is performed in the controller 102 in response to receiving a request for a random read (e.g., a series of reads in non-consecutive memory locations), as fast reads may be more desirable in this situation than in a sequential read situation (e.g., a series of reads in consecutive memory locations). As shown in FIG. 7, in this example, the controller 102 first looks to see if the read is within the first five wordlines (act 710). As mentioned above, in some memory designs, the first five wordlines (or some other number N wordlines) are more susceptible to bit errors and, thus, may be undesirable for a fast read. If the read is to the first five wordlines, the controller 102 then checks to see if the read is to the middle of a page (act 720). As mentioned above, in TLC memories, a read to the middle of a page can be more error prone.

In this example, if the controller 102 determines that the read is to the first five word lines and is to the middle of a page, the controller 102 determines that it is likely that the bit-error rate will exceed the threshold and that a normal read should be used instead of a fast read (act 730). If not, the controller 102 determines if the temperature of the memory 104 (e.g., as determined by the temperature sensors 153) is higher than a certain temperature threshold (75 degree C., in this example) (act 740). As mentioned above, an increased temperature can increase the likelihood of bit errors. If the memory temperature is above the temperature threshold, the controller 102 determines that it is likely that the bit-error rate will exceed the threshold, and a normal read should be used instead of a fast read (act 730). In contrast, if the memory temperature is below the temperature threshold, the controller 102 determines that it is not likely that the bit-error rate will exceed the threshold. In this case, the controller 102 instructs the memory 104 to operate in the fast read mode (act 760). Optionally, the controller 102 can increase power supply to the memory 104 (act 750), as the bit-error rate in fast read is dependent on the internal Vcc power supply noise, and temporarily increasing the PMIC Vcc supply to the targeted memory channel(s)/die(s) by a certain amount (e.g., 250 mV-1000 mV) can help reduce the bit error rate. When normal read mode is resumed, the PMIC can reduce the power supply to the nominal values for the non-fast read case on the memory die.

There are several advantages associated with these embodiments. In general, these embodiments provide faster system read with higher data integrity from a system perspective, resulting in a more-reliable system with overall higher-performance fast reads as compared to other storage systems. These embodiments can be used to provide a storage system design approach for achieving the fastest possible read speed with minimum loss of data integrity by identifying when and how to best use the fast read mode without elevating the bit error rate over a threshold. Further, these embodiments provide a system-side solution to a memory die problem. That is, fast read relies on the memory die's internal timing reduction to speed the sensing operation, leading to an intrinsically-higher bit-error rate for the read and, thus, error correction decoding time, which in turn diminishes the performance of the random read. Using multiple variables or conditions at the system level to control how/when to use the memory's high speed (but noisier) read mode, the controller 102 can set the conditions for the system to take the advantages of the memory's high speed read operation without sacrificing the bit-error rate threshold beyond which the system performance will suffer. As noted above, these variables/conditions can include being aware that a higher power supply leads to less noisy memory operation (thus increasing the fast read integrity for less bit error rate), that certain physical locations and page types are sensitive to fast reads where higher BER is incurred compared to other location, and that fast read is sensitive to temperature. This awareness by the controller 102 provides a high-performance fast read operation that can meet fast random access time requirements for a high-performance storage system. That is, making system-level decisions on how to configure the system for optimum performance with respect to the memory behavior can help storage system vendors maximize system performance within the ultimate limits of the memory read operation and the memory's bit error rate.

There are several alternatives that can be used with these embodiments. For example, as noted above, in general, the higher the temperature, the more likely it is that there will be a bit-error due to increased noise. However, in some embodiments, if programming occurred at a high temperature, it may be preferred to read at that same high temperature. This is because, in certain situations, the bigger the temperature delta between write and read, the higher the bit-error rate. Accordingly, in an alternate embodiment, the storage system 100 stores the temperature value of a memory location when it is written. That way, the controller 102 can compare the temperature of the memory location at read with the stored temperature value and make the decision on whether or not to perform a fast read based on whether the temperature delta exceeds a threshold.

Figure 8:
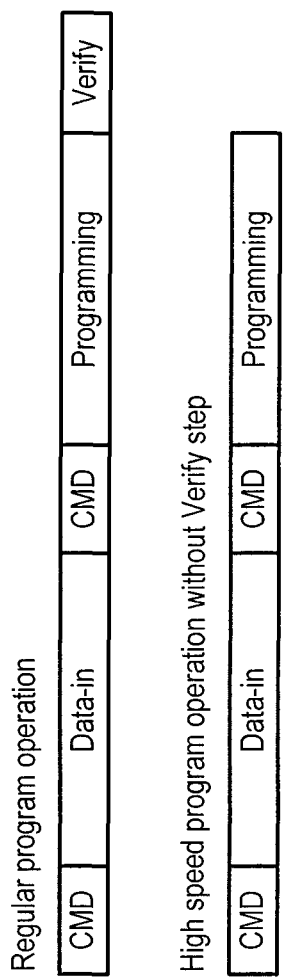
FIG. 8 is a diagram showing regular and high (fast) writes of an embodiment.

Other alternatives are possible. For example, instead of or in addition to the fast read embodiments discussed above, the storage system 100 can include a fast write embodiment. In some memory devices, the memory receives a command from the controller instructing the memory to program data into a location in the memory. After the memory programs the data, it reads the data from the location to verify that the data has been written correctly. This is shown in the top line in FIG. 8. If the data was not written correctly, the memory can re-program the memory cells. If the data was written correctly, the memory can provide a response back to the controller that the program operation was successful.

In a fast write situation, the controller can instruct the memory (e.g., via a trim command) to skip the verify operation. This is shown in the bottom line in FIG. 8. Skipping the verify operation results in a faster overall programming operation (in some embodiments, the verify operation takes about 30% of the program time). Fast writes may be preferred in many situations, such as in a high-capacity SSD system that requires very-high sequential-write performance with overall higher performance of the programming operation. However, skipping the verify step can result in a higher bit-error rate because errors that could have been caught during the verify operation are not. This embodiment addresses this by recognizing that certain conditions and variables in the storage system can determine the performance impact of a fast write. More specifically, in the following embodiments, the controller 102 (e.g., the fast read/fast write module 111) can be configured to determine whether to instruct the memory 104 to operate in a fast write mode based on whether a storage system criterion is satisfied. As used herein, a "storage system criterion" (sometimes called a "system configuration") can refer to a structural or operating conditions of the storage system 100, such as, but not limited to, a memory type (e.g., single-level cell (SLC) memory), a program-erase count of a block of memory, where a bottleneck is in the system 100, how many channels are used, type of write mode, memory temperature, and power supply level.

For example, the storage system criterion can be satisfied when the memory 104 comprises single-level cells (SLCs). Unlike multi-level cells, only a single programming pulse is needed to program an SLC cell. As a result, there is not a significant chance of the memory cell not being programmed correctly. Even if there is an error, it is likely that error correction functionality (e.g., LDPC) can handle the error. Further, in some storage systems, there would not be enough time during the allotted duration for a program operation to apply a second program pulse to correct the error. Accordingly, SLC memory is a good candidate for a fast write.

As another example, the storage system criterion can be satisfied when the program-erase count (PEC) of the memory 104 is under a threshold. This example recognizes that programming errors are less prone in "fresh" memory (e.g., at beginning of life (BOL)) than in memory that has endured a lot of program and erase cycles (e.g., at end of life (EOL)). Consider, for example, a situation in which the high-speed programming mode is at "M" MB/s at PEC<Threshold (e.g., M=325 MB/s) and the regular-speed mode is at "N" MB/s at the PEC>Threshold (e.g., N=250 MB/s).

In high-speed programming mode, an SLC block in the memory 104 uses only a program-pulse step (no program-verify step). In this example, it is assumed that the program-verify step is redundant for PEC threshold<50K, as that is considered beginning of life (BOL) in this example. In contrast, if the PEC is over the threshold, the memory will use the regular-speed programming mode in which a program-verify step is performed after the program pulse. In this example, it is assumed that PEC>50K implies that the memory is at end of life (EOL) and there may be a greater likelihood of programming errors. In this way, by looking at the PEC of the memory 104, the controller 102 can accommodate system requirements for performance enhancement via a high-speed write without sacrificing data integrity (e.g., by sacrificing the bit error rate threshold beyond which system performance will suffer).

Figure 9:
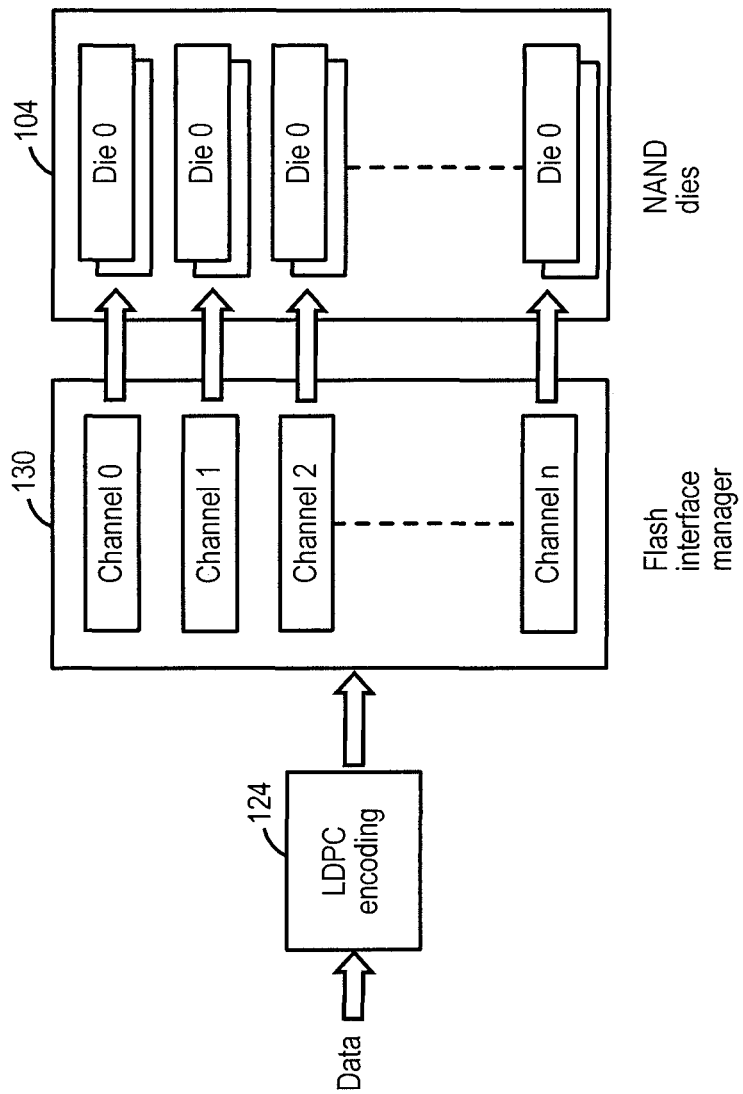
FIG. 9 is a system data path view of an embodiment.

As yet another example, the storage system criterion can be satisfied by determining that the fast-write mode will achieve higher performance versus there being a performance bottleneck upstream of the memory 104. This embodiment will be illustrated in conjunction with the diagram in FIG. 9, which shows several components inside the storage system 100 of an embodiment. As shown in FIG. 9, in this example, the memory 104 comprises a plurality of NAND dies that are organized into several channels, as established by the flash interface manager 130. Here, each channel has at least one die. However, other configurations are possible. For example, instead of being a multi-die, multi-channel system (e.g., n being multiples of 2), the storage system 100 can include a single channel (e.g., n=0).

As also shown in FIG. 9, error correction circuitry 124 (here, an LDPC encoder) encodes data before it is supplied to the flash interface manager 130 for transmission to the memory 104 via the channels. In some situations, the encoding speed of the encoder 124 can be a bottleneck, meaning that a fast write will not incur a performance increase (although it still can incur a data integrity penalty because the verify step is skipped). Accordingly, in one embodiment, the controller 102 conducts this analysis before instructing the memory 104 to enter the fast write mode. The following example will illustrate how the controller 102 can gauge the LDPC engine 124 encoding speed in order to match up the memory cell programming performance, thereby becoming intelligent regarding the capacity configuration for the program operation.

In this example, the SLC program speed is 250 MB/s per die. If there are eight channels, the eight-die parallel operation will lead to 2000 MB/s. The storage system has a given spec for the LDPC engine 124 throughput speed (e.g., including scrambling, encoding, and header combinations). If the LDPC encoding speed is 3200 MB/s, then the bottleneck will be the memory cell performance, which in theory should go up to 400 MB/s. In this situation, the controller 102 can determine that a fast write is warranted. On the other hand, if the system 100 has 32 dies operating in parallel, then at a 250 MB/s program speed on the memory, the LDPC engine 124 will become the bottleneck as it cannot keep up with encoding data at the speed required by the memory, resulting in idle die(s) for programming. In this situation, the controller 102 can determine that a fast write is not warranted.

In the above example, the controller 102 looked at whether the memory die parallel operating speed is less than the encoding speed. In a variation of this embodiment, the controller 102 can instead perform this analysis by comparing a number of memory dies being operated in parallel against a threshold. For example, in an eight-channel system, a fast write is warranted when fewer than eight dies are used. That is, when 8*M<X (=3200), then the memory performance is the bottleneck for performance, and a high-speed write will increase performance. However, when more than eight dies are used (e.g., n=16), 16*N>X (=3200), the LDPC throughput—not memory performance—is the bottleneck for performance. In this case, a regular-speed write is warranted.

Figure 10:
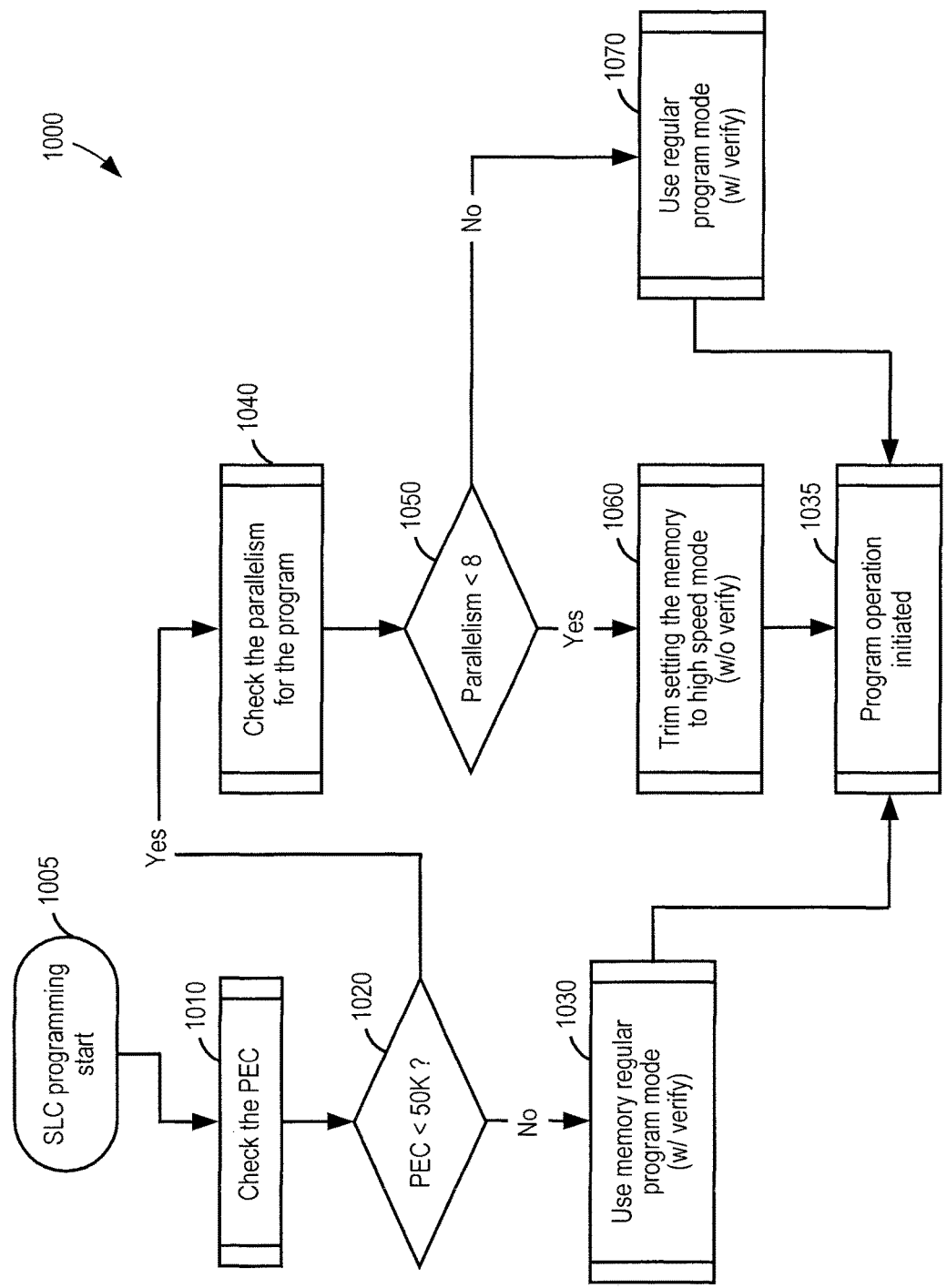
FIG. 10 is flow chart of a method of an embodiment for high speed write.

It should be noted that the controller 102 can consider other storage system criterion as well, including, but not limited to power (the higher the power, the more stable the program operation), temperature (the lower the temperature, the faster the program operation), and write mode (sequential may be preferred for fast writes). Also, as with the fast read embodiments, these various factors can considered alone or in combination. As an illustration of this, FIG. 10 shows a flow chart 1000 in which several factors are considered. As shown in FIG. 10, at the start of an SLC programming operation (act 1005), the controller 102 checks the program-erase count (PEC) of a block to be programmed (act 1010). If the PEC is above a threshold (here, 50) (act 1020), the controller 102 lets the memory 104 operate in the normal read mode (with verify) (act 1030), and the program operation is initiated (act 1035). However, if the PEC is below the threshold, the controller 102 checks the parallelism for the program (act 1040). If the parallelism is below a threshold (here, 8 channels) (act 1050), the controller 102 trims the setting in the memory 104 for the high-speed mode (without verify) (act 1060). If the parallelism is above the threshold, the controller 102 lets the memory 104 operate in the normal read mode (with verify) (act 1070).

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A method for reading a memory of a storage system, the method comprising:
    determining whether a bit error rate (BER) of a read of a data in a read location in a first read mode, is likely to exceed a first threshold, the determining comprising:
        identifying a location of the read;
        determining whether the read is to one of an identified set of word lines; and determining that the BER is likely to exceed the first threshold if the read is to one of the identified set of word lines;

determining to operate the memory in the first read mode based on determining that the BER is not likely to exceed the first threshold;

operating the memory in the first read mode, wherein the memory is configured to read the data in the read location at a time that is earlier than when the memory reads data in a second read mode; and reading the data in the memory using the first read mode.

2. The method of claim 1 further comprising increasing a power supply to the memory when operating the memory in the first read mode.

3. The method of claim 1, wherein the determining whether the BER is likely to exceed the first threshold is performed in response to receiving a request for a random read.

4. The method of claim 1, wherein the determining whether the BER is likely to exceed the first threshold is further based on a temperature of the memory.

5. The method of claim 1, wherein the memory comprises a multi-level cell (MLC) memory.

6. The method of claim 1, wherein the memory comprises a three-dimensional memory.

7. The method of claim 1, wherein the storage system is embedded in a host.

8. A storage system comprising:
a memory configured to operate in a first write mode and a second write mode, wherein in the first write mode, the memory is further configured to skip a verify operation that is performed in the second write mode;
a controller configured to:
 determine a storage system criterion is satisfied; and
 instruct the memory to operate in the first write mode based on determining the storage system criterion is satisfied, and
an error correction code encoder configured to operate at a first encoding speed, wherein the storage system criterion is satisfied when a memory die parallel operating speed is less than the first encoding speed.

9. The storage system of claim 8, wherein the storage system criterion is satisfied when a program-erase count of the memory is under a threshold.

10. The storage system of claim 8 wherein the memory comprises a plurality of memory dies.

11. The storage system of claim 8, wherein the memory comprises a plurality of memory dies, and wherein the storage system criterion is satisfied when a number of memory dies being operated in parallel is below a threshold.

12. The storage system of claim 8, wherein the storage system criterion is satisfied when the memory comprises single-level cells (SLCs).

13. The storage system of claim 8, wherein in the second write mode, the memory is configured to perform the verify operation to check that data has been written correctly in the memory.

14. The storage system of claim 8, wherein the memory comprises a three-dimensional memory.

15. The storage system of claim 8, wherein the storage system is embedded in a host.

* * * * *